Figure 1:
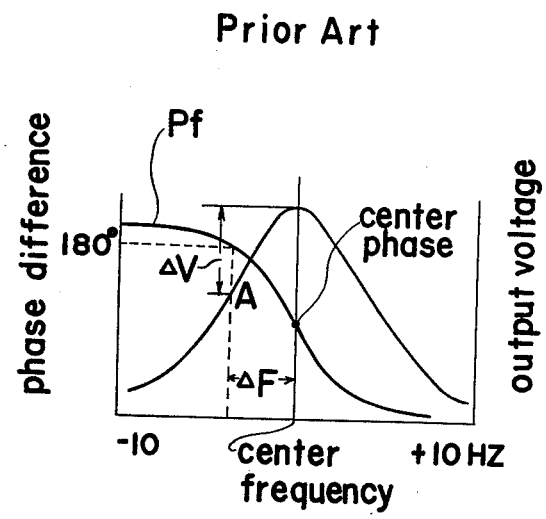

United States Patent [19]

Nakamura

[11] 4,028,640

[45] June 7, 1977

[54] PIEZO-ELECTRIC TUNING FORK OSCILLATION CIRCUIT

[75] Inventor: Takeshi Nakamura, Hakui, Japan

[73] Assignee: Murata Manufacturing Co., Ltd., Kyoto, Japan

[22] Filed: Mar. 12, 1976

[21] Appl. No.: 666,268

[30] Foreign Application Priority Data

Mar. 13, 1975 Japan .............................. 50-30756

[52] U.S. Cl. .............................. 331/116 R; 310/9.6; 331/163
[51] Int. Cl.² .......................................... H03B 5/36
[58] Field of Search ............... 331/116, 158, 163; 310/9.6

[56] References Cited

UNITED STATES PATENTS

| | | | |
|---|---|---|---|
| 3,713,045 | 1/1973 | Usuda et al. | 331/116 |
| 3,946,257 | 3/1976 | Kawamura | 310/9.6 |

FOREIGN PATENTS OR APPLICATIONS

| | | | |
|---|---|---|---|
| 46-4525 | 9/1971 | Japan | 331/116 |
| 46-6122 | 7/1971 | Japan | 331/116 |
| 46-25162 | 7/1971 | Japan | 331/116 |
| 46-34642 | 11/1971 | Japan | 331/116 |

Primary Examiner—John Kominski
Attorney, Agent, or Firm—Birch, Stewart, Kolasch and Birch

[57] ABSTRACT

A piezo-electric tuning fork oscillation circuit including a piezo-electric tuning fork and amplifier units, such as ordinary audio frequency signal amplifier circuits employing transistors, between which amplifier units, a phase correction circuit comprising resistance and capacitance is inserted. In the phase correction circuit, the oscillation frequency coincides with the center frequency of the tuning fork over a wide frequency range with phase shift angle of the correction circuit being adapted to increase as the frequency increases, for producing stable oscillating frequency with possible maximum oscillation output.

5 Claims, 7 Drawing Figures

Prior Art

PIEZO-ELECTRIC TUNING FORK OSCILLATION CIRCUIT

The present invention relates to an oscillation circuit and more particularly, to a piezo-electric tuning fork oscillation circuit employing a piezo-electric tuning fork for use in electrical and electronic equipment.

Recently, a piezo-electric tuning fork has widely been employed in elecrical and electronic devices. Although a phase difference between the input signal and output signal of such a tuning fork presents no inconvenience in its function so long as the piezo-electric tuning fork is used as a filter element, the same phase difference brings about various problems when the piezo-electric tuning fork is employed as an oscillating element in an oscillation circuit. Commonly, in such oscillation circuits, a positive feedback circuit must be established for the oscillation to take place. In general, the piezo-electric tuning fork with an inherent phase of +90° has a phase difference the between input and output signals thereof, the degree of which phase difference varies according to the frequency employed and external impedances related thereto. For example, when the piezo-electric tuning fork is coupled to a one stage amplifier, phase a difference of 180° exists between the input and output signals, while such phase difference is 0° in the case of a two stage amplifier, and 180° in a three stage amplifier, which fact requires employment of a phase correction circuit for a piezo-electric tuning fork oscillation circuit to function satisfactorily. It is to be noted here that in the one stage tuning fork oscillation circuit, oscillations are not produced unless the phase difference between the input and output signals of the tuning fork is 0° or 180°.

Referring to FIG. 1 showing the relation between frequency, phase difference and output voltage in the conventional piezo-electric tuning fork oscillation circuit of one stage amplification, it will be seen from a curve pf plotted therein and representing the relation between the phase difference and frequency that the oscillating frequency differs from the center frequency, resulting in unstable oscillation, with a drop in output voltage by $\Delta V$ as shown, which means that the output is small to that extent as compared with oscillation at the center frequency. More specifically, if a phase difference of 180° is employed for correction of the phase difference, the output voltage drops by $\Delta V$ with respect to the output at the center frequency, with consequent frequency deviation or drift by $\Delta F$ from the center frequency as at a point A, and thus the requirements in optimum oscillation to generate maximum output voltage at the center frequency without any phase deviation can not be met.

Accordingly, in order to achieve optimum functioning of the tuning fork oscillation circuit, it is absolutely necessary to cause the oscillation to take place at the center frequency of the piezo-electric tuning fork through positive feedback, without giving rise to any frequency deviation, for which purpose, a phase correction circuit, i.e. a circuit for differentiating the phases at the input and output sides for imparting phase difference therebetween should be employed. In other words, in the one stage amplification piezo-electric tuning fork oscillation circuit, the phase difference of 0° or 180° in the amplifier stage at the output side of the tuning fork having an inherent phase difference of +90° must be rendered to be 0° or 180° also at the input side of the tuning fork through insertion of the phase correction circuit between the input side of the tuning fork and the output side of the amplifier for phase correction. More specifically, in using a piezo-electric tuning fork for one specific frequency, the phase shift angle at the phase correction circuit and the phase difference angle at the tuning fork have only to be 0° or 180° at the center frequency of the tuning fork, irrespective of the type of the phase correction circuit employed in order to cause the oscillation to take place at the center frequency of the tuning fork.

Figure 3:
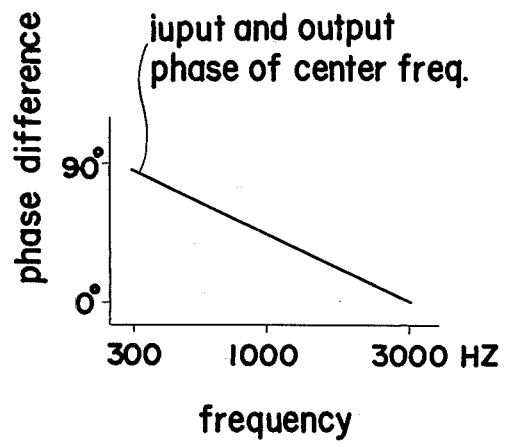

However, in cases where piezo-electric tuning forks having various center frequencies are to be used through replacement or switching over from one tuning fork to another, the phase difference angles of the tuning fork differ according to the frequencies to be dealt with, the general trend being such that the phase difference angle decreases as the frequency increases due to the influence of the electrostatic capacity of the tuning fork, for example, as shown in FIG. 3 with reference to two stage amplification.

Figure 2:
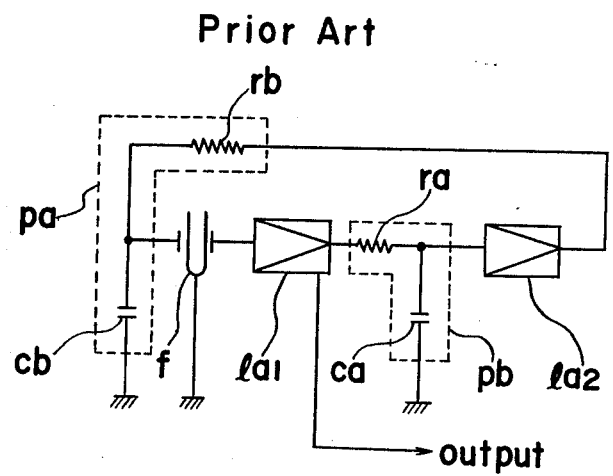

One example of such conventional piezo-electric tuning fork oscillation circuit of two stage amplification includes, as shown in FIG. 2, a tuning fork $f$ connected, at its output terminal, to a amplifier $la\ 1$ from which oscillation output is taken out and which is further coupled to the input side of another amplifier $la\ 2$ through a resistor $ra$, with a junction between the resistor $ra$ and the amplifier $la\ 2$ being connected to earth through a capacitor $ca$, while the input side of the tuning fork $f$ is connected to the output side of the amplifier $la\ 2$ through a resistor $rb$, with a common junction between the input terminal of the tuning fork $f$ and the resistor $rb$ being further connected to earth through a capacitor $cb$, thus the resistor $rb$ and capacitor $cb$, and also the resistor $ra$ and capacitor $ca$ respectively forming two-stage phase correction circuits $Pa$ and $Pb$ as shown.

Figure 4:
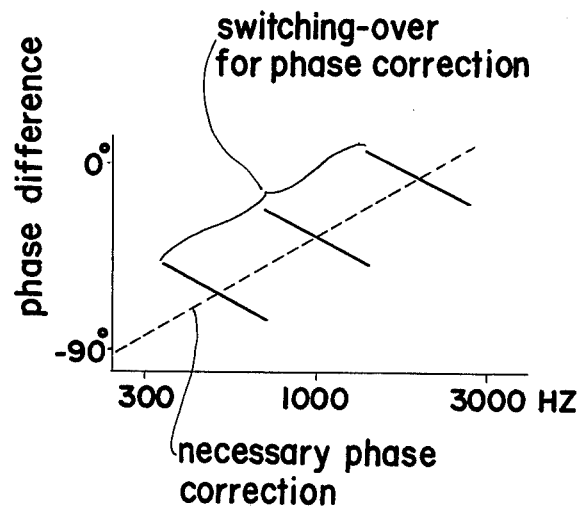

In the known tuning fork oscillation circuit of two stage amplification as shown in FIG. 2, as the phase difference angle at the tuning fork decreases with the increase of frequency, the phase shift angle of the phase correction circuit should be arranged to increase as the frequency increases for satisfactory correction. Since the conventional tuning fork circuit of two stage amplification has the phase shift angle at its tuning fork decreasing as the frequency increases as shown in FIG. 3, a plurality of phase correction circuits must be employed for switching over from one circuit to another as shown in FIG. 4, in which it is to be noted that the phase difference is of −90°.

In order to cope with the above described disadvantage, there has conventionally been proposed a piezo-electric tuning fork oscillation circuit wherein the phase shift angle thereof increases as the frequency increases. This oscillation circuit, however, still has a serious disadvantage in that the amount of variation of the phase shift angle employed therein is so large that a CR phase shift circuit of at least two stage is inevitably required, which disadvantage of the prior art circuit is considered possibly due to employment of piezo-electric tuning forks having piezo-electric elements of the same size and also to absence of proper impedance matching of such tuning forks with respect to external circuits included in the oscillation circuit.

Accordingly, an essential object of the present invention is to provide a piezo-electric tuning fork oscillation circuit for use in electrical and electronic equipment in which one phase correction circuit is employed wherein the oscillation frequency coincides with the center frequency of a tuning fork over a wide frequency range, with the phase shift angle of the phase correction circuit being adapted to increase with the increase of the frequency, so as to substantially eliminate disadvantages inherent in the conventional piezoelectric tuning fork oscillation circuits.

Another important object of the present invention is to provide a piezo-electric tuning fork oscillation circuit of the above described type in which the oscillating frequency is stable with the oscillation output therefrom being kept at the possible maximum level obtainable from the oscillation circuit.

A further object of the present invention is to provide a piezo-electric tuning fork oscillation circuit of the above described type which is stable in functioning and simple in construction with consequent low manufacturing cost.

According to a preferred embodiment of the present invention, the piezo-electric tuning fork oscillation circuit includes a piezo-electric tuning fork and two amplifiers such as ordinary audio frequency signal amplifiers employing transistors, between which amplifiers a phase correction circuit comprising a resistor and series-connected capacitor and resistor is inserted, which tuning fork oscillation circuit is particularly characterized in that the oscillation frequency is in agreement with the center frequency at the tuning fork over a wide frequency range with the phase shift angle of the phase correction circuit being adapted to increase as the frequency increases, through employment of one phase correction circuit. More specifically, in the tuning fork oscillation circuit of the invention, there is provided a compensation circuit in which the phase difference is compensated according to variations of frequency i.e., a phase correction circuit wherein the phase difference of the piezo-electric tuning fork is varied through variations of frequency for phase correction. Additionally, for perfect compensation by the phase correction circuit, in the tuning fork oscillation circuit of the invention, sizes i.e., areas and thicknesses of piezo-electric elements applied to input and output sides of the tuning fork to form a capacitor therein should preferably be so arranged as to reduce the equivalent electrostatic capacity of the tuning fork, and/or impedances of external circuits connected to input and output sides of the tuning fork be perfectly matched with impedance of the tuning fork, by which arrangement, variations of the phase difference of the tuning fork due to frequency variations can be reduced to an optimum level.

Figure 5:
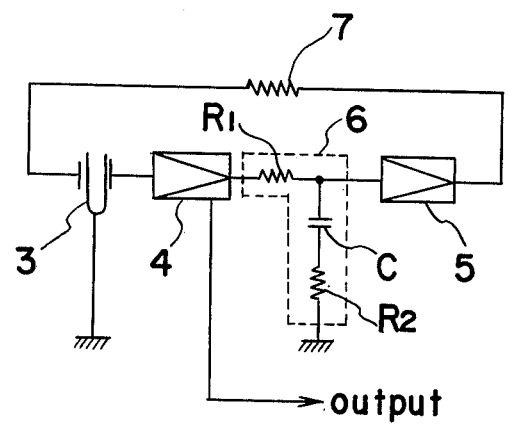
Figure 6:
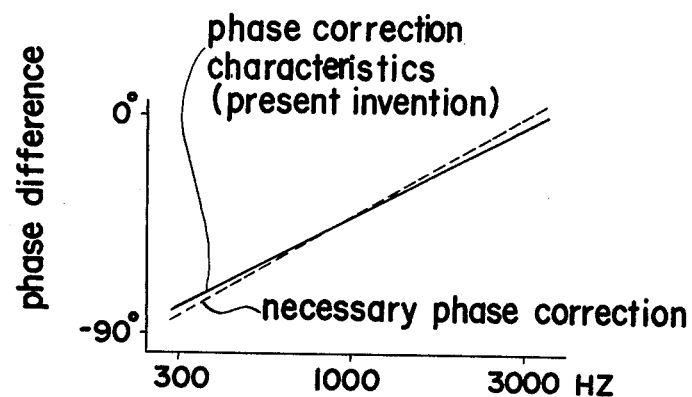
Figure 7:
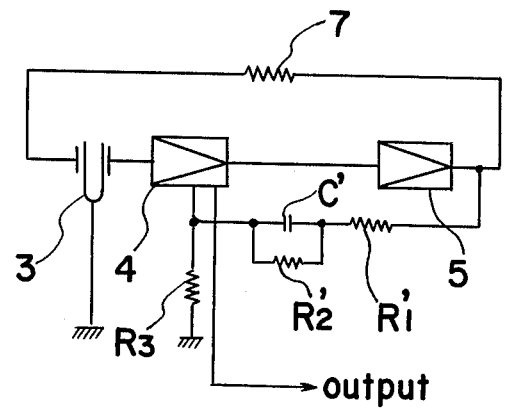

These and other objects and features of the present invention will become apparent from the following description taken in conjunction with the preferred embodiment thereof with reference to the accompanying drawings in which;

FIG. 5 is an electrical circuit diagram of a piezo-electric tuning fork oscillation circuit according to one embodiment of the present invention, FIG. 6 is a graph showing phase correction characteristics of a phase correction circuit employed in the tuning fork oscillation circuit of FIG. 5, and FIG. 7 is a similar diagram to FIG. 5, but particularly shows a modification thereof.

Before the description of the present invention proceeds, it is to be noted that like parts are designated by like reference numerals throughout several views of the attached drawings.

Referring now to FIGS. 5 and 6, there is shown a piezo-electric tuning fork oscillation circuit according to one embodiment of the present invention, which tuning fork oscillation circuit includes a piezo-electric tuning fork 3 connected, at its output terminal, to an impedance-matched amplifier 4, for example, an ordinary audio frequency signal amplifier employing transistors, from which the oscillation output is taken out and which is further coupled, at its output terminal, to the input side of another amplifier 5 of similar type through a resistor R1 (or output impedance of the amplifiers 4), with a common junction of the resistor R1 and the amplifier 5 being earthed through a series-connected capacitor C and a resistor R2, thus the resistor R1, the capacitor C and the resistor R2 forming a phase correction circuit 6 enclosed in the dotted line in FIG. 5, while the input terminal of the tuning fork 3 is connected to the output side of the amplifier 5 through a matching resistor 7 (or output impedance of the amplifier 5) as shown, by which arrangement, one stage phase correction circuit 6 of the resistor R1, capacitor C and resistor R2 having phase characteristics wherein the oscillation frequency coincides with the center frequency of the tuning fork over a wide frequency range as shown in FIG. 6 is incorporated in the oscillation circuit, with the phase shift angle thereof being adapted to increase as the frequency increases, for producing stable oscillating frequency with maximum oscillation output therefrom, thus switching-over and adjustments for phase correction being dispensed with over a wide range of frequency to achieve an almost perfect phase correction. Accordingly, in the above described piezo-electric tuning fork oscillation circuit of the invention, since deviation from the center frequency is almost negligible, the output voltage from the oscillation circuit is stable, with extremely small variation over a wide range of frequency, thus adjustments of the output voltage being made unnecessary.

It should be noted here that since the above described piezo-electric tuning fork oscillation circuit of the invention is of a one stage phase shift circuit, the sizes and configurations, i.e., areas and thicknesses of piezo-electric elements applied to the input and output sides of the tuning fork to form a capacitor therein should preferably be so arranged as to reduce the equivalent electrostatic capacity of the tuning fork, and/or impedances of external circuits connected to the input and output sides of the tuning fork be perfectly matched with impedance of the tuning fork, by which arrangement, deviations in the inclination angles of phase correction characteristics being advantageously eliminated over a wide frequency range such as 300 to 3000 Hz even in the one stage phase shift circuit.

Referring now to FIG. 7, there is shown a modification of the piezo-electric tuning fork oscillation circuit of FIG. 5. In this modification, the phase correction circuit 6 described as inserted between the amplifiers 4 and 5 in the circuit of FIG. 5 is replaced by series-connected resistor R1' and capacitor C' which are connected between the amplifier 4 and the output side of the amplifier 5, with a resistor R2' being connected in parallel with the capacitor C', while the amplifiers 4 and 5 are directly connected to each other, with the amplifier 4 being further connected to earth through a resistor R3. Since the functioning and effect of the circuit of FIG. 7 are similar to those of FIG. 5, the detailed description thereof is abbreviated for brevity.

As is clear from the foregoing description, according to the piezo-electric tuning fork oscillation circuit of the invention, switching-over and adjustments for phase correction are unnecessary for a wide range of frequency through adoption of the one stage phase correction circuit having characteristics wherein the oscillation frequency coincides with the center frequency of the tuning fork over a wide frequency range, with the phase shift angle of the phase correction circuit being adapted to increase with the increase of the frequency for producing stable oscillating frequency with possible maximum oscillation output therefrom, while fine adjustments of phase are also made possible through variations of resistance values in the phase correction circuit and/or capacitance of the piezo-electric tuning fork. Furthermore, alteration of the oscillation frequency is readily effected by more replacement of piezo-electric tuning forks, while the same piezo-electric tuning fork can be used, for example, both for signal transmission and reception. Additionally, since the phase correction circuit also serves as a high-pass filter circuit, gain of the oscillation circuit during spurious radiation is eliminated, thus undesirable spurious radiation being advantageously eliminated.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as being included therein.

What is claimed is:

1. A piezo-electric tuning fork oscillation circuit which comprises a piezo-electric tuning fork and an external circuit coupled to said piezo-electric tuning fork, said external circuit being provided with a phase correction-circuit including resistor and capacitor elements, with said phase correction circuit having phase characteristics wherein the oscillation frequency coincides with the center frequency of the piezo-electric tuning fork over a wide frequency range, with the phase shift angle of said phase correction circuit being adapted to increase with increase of the frequency for producing stable oscillation having the maximum oscillation output obtainable from said phase correction circuit.

2. A piezo-electric tuning fork oscillation circuit as claimed in claim 1, wherein input and output impedances of said piezo-elecric tuning fork are precisely matched with input and output impedances of said external circuit.

3. A piezo-electric tuning fork oscillation circuit as claimed in claim 1, wherein said piezo-electric tuning fork includes piezo-electric elements applied thereto so as to form equivalent electrostatic capacity in said tuning fork, said piezo-electric element being so formed, in configuration thereof, as to minimize the equivalent electrostatic capacity of said tuning fork.

4. A piezo-electric tuning fork oscillation circuit which comprises a piezo-electric tuning fork, a first amplifier and a second amplifier, said tuning fork being connected, as its output terminal, to the input side of said first amplifier from which the oscillation output is taken out and which is further connected, at its output side, to the input side of said second amplifier through a first resistor, with a junction of said first resistor and the input side of said second amplifier being connected to earth through a series-connected capacitor and second resistor, said tuning fork being further connected, at its input terminal, to the output side of said second amplifier through a third resistor.

5. A piezo-electric tuning fork oscillation circuit which comprises a piezo-electric tuning fork, a first amplifier and a second amplifier, said tuning fork being connected, at its output terminal, to the input side of said first amplifier from which the oscillation output is taken out and which is further connected to the input side of said second amplifier and also to the output side of said second amplifier through a series-connected capacitor and first resistor, with a second resistor being connected in parallel with said capacitor, said first amplifier being further connected to earth through a third resistor, said tuning fork being connected, at its input terminal to the output side of said second amplifier through a fourth resistor.

* * * * *